US007868536B2

(12) United States Patent
Aurongzeb

(10) Patent No.: US 7,868,536 B2
(45) Date of Patent: Jan. 11, 2011

(54) ORGANIC LIGHT EMITTING DEVICE

(75) Inventor: Deeder Aurongzeb, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 262 days.

(21) Appl. No.: 12/258,833

(22) Filed: Oct. 27, 2008

(65) Prior Publication Data

US 2010/0102708 A1  Apr. 29, 2010

(51) Int. Cl.
*H01L 51/50* (2006.01)
*H01L 51/52* (2006.01)
*H01L 51/56* (2006.01)

(52) U.S. Cl. .............. 313/503; 313/504; 313/506; 445/24

(58) Field of Classification Search ......... 313/500–512; 428/690; 445/24, 25
See application file for complete search history.

(56) References Cited

U.S. PATENT DOCUMENTS

| 2005/0227108 | A1 | 10/2005 | Lewis et al. |
| 2006/0127562 | A1 | 6/2006 | Lewis et al. |
| 2007/0222371 | A1 | 9/2007 | Raychaudhuri et al. |
| 2008/0136321 | A1 | 6/2008 | Do et al. |
| 2008/0138539 | A1 | 6/2008 | Breitung et al. |
| 2008/0258612 | A1* | 10/2008 | Kim et al. ................. 313/504 |

FOREIGN PATENT DOCUMENTS

| EP | 1 668 717 |   | 9/2008 |
| JP | 2003068470 | A * | 3/2003 |
| WO | WO 2006/065965 |   | 6/2006 |

OTHER PUBLICATIONS

C.M.Hsu, et al., Surface Ni-Doped ITO Films for OLED Application, *Proceedings of SPIE*, vol. 5214 (2004).
T.Matsushima, et al., Marked Improvement in Electroluminescence Characteristics of Organic Light-Emitting Diodes Using an Ultra-Thin Hole-Injection Layer of Molybdenum Oxide, *Journal of Applied Physics*, vol. 104, Issue 5, (2008).
M.Segal, et al., Extrafluorescent Electroluminescence in Organic Light-Emitting Devices, *Nature Materials*, vol. 6, May 2007.
W. Staroske, et al., Single-Step Triplet-Triplet Annihilation: An Intrinsic Limit for the High Brightness Efficiency of Phosphorescent Organic Light Emitting Diodes, *Phys. Rev. Lett.*, 11;98(19):197402 (2007) Epub May 10, 2007.

* cited by examiner

*Primary Examiner*—Mariceli Santiago
(74) *Attorney, Agent, or Firm*—Fay Sharpe LLP

(57) ABSTRACT

An organic light emitting device including an anode including a lanthanide oxide. The lanthanide oxide is doped with a conductive material including rubidium, titanium, or combinations thereof. The organic light emitting device further includes a cathode, an organic hole transport layer intermediate the anode and cathode, and an electron injection layer intermediate the anode and cathode.

25 Claims, 3 Drawing Sheets

ORGANIC LIGHT EMITTING DEVICE

BACKGROUND OF THE DISCLOSURE

The present invention relates generally to a lighting application, and more particularly to a light source comprising an organic light emitting device with improved efficiency.

An organic light emitting device (OLED) is a type of a light emitting diode that emits light in response to an applied potential. A typical OLED comprises an anode, one or more organic material layers and a cathode. Cathodes generally comprise a material having a low work function such that a relatively small voltage causes the emission of electrons. Some commonly used material include calcium and metals, such as gold, indium, manganese, tin, led, aluminum, silver, magnesium, a silver/magnesium alloy or combinations thereof. Such materials, although having a low work function, exhibit relatively low melting points and/or exhibit high degradation when exposed to oxygen or water. Anodes generally comprise a transparent material having high work function value such as indium tin oxide (ITO), tin oxide, nickel, or gold. A layer of molybdenum oxide ($MoO_3$) may be included to reduce the overall driving voltage.

One of the layers of the OLED comprises a material having the ability to transport holes, and is referred to as the hole transport layer. Another layer typically comprises a material having the ability to transport electrons, known as the electron transport layer. This layer may also function as the luminescent material (or emission layer) or an additional independent layer may be disposed between the hole transport layer and the electron transport layer. When a voltage is applied, a current of electrons flow through the device from the cathode to the anode. The anode injects positive charges (holes) into the hole transport layer, while the cathode injects negative charges (electrons) into the electron transport layer. Electrostatic forces bring the electrons and the holes together and they recombine near the light emitting layer, which causes a drop in energy levels and an emission of radiation in the range of visible light.

Significant efforts have been made in selecting materials and forming modified layer structures or materials in OLEDs to achieve improved performance. Numerous OLEDs with alternative layer structures have been disclosed. For example, OLEDs have been created containing additional functional layers. Some of these new layer structures with new materials have indeed resulted in improved device performance.

One OLED variation is illustrated, for example, in Toshinori Matsushima et al., "Marked improvement in electroluminescence characteristics of organic light-emitting diodes using an ultra-thin hole-injection layer of molybdenum oxide," 104 Journal of Applied Physics 1-6 (2008). The OLED includes an aluminum cathode, an electron-injection layer comprising lithium fluoride, a light emitting electron-transport layer of tris(8-hydroxyquinoline) aluminum (III) ($Alq_3$), a naphthyl-substituted benzidine derivative (α-NPD) hole transport layer, a molybdenum oxide ($MoO_3$) hole injecting layer and an indium tin oxide (ITO) anode. The $MoO_3$ thickness was said to be optimized to provide the lowest driving voltage, highest power conversion efficiency, and longest lifetime for the OLED. However, this configuration, although an improvement for the specific materials used, did not address some significant issues facing OLEDs. In particular, the Alq3 and α-NPD layers display narrow emission ranges and the OLEDs as a whole display low injection efficiency when the electron comes from an aluminum cathode. Furthermore, the interface coupling between ITO and $MoO_3$ is weak, further lowering overall efficiency of the OLED.

Therefore, there is a continued need to improve OLED structure and further enhance the performance and efficiency of an OLED for use as a light source.

SUMMARY OF THE DISCLOSURE

In one aspect, the present disclosure relates to an organic light emitting device including an anode. The anode includes a lanthanide oxide. The lanthanide oxide is doped with a conductive material including at least one of rubidium and titanium. The organic light emitting device further includes a cathode, an organic hole transport layer intermediate the anode and cathode and an electron injection layer intermediate the anode and cathode.

In another aspect, the present disclosure relates to a method of manufacturing an organic light emitting device. The method includes the steps of forming an anode including a lanthanide oxide doped with at least one of titanium and rubidium, forming a cathode, disposing an organic hole transport layer intermediate said anode and cathode, and disposing an electron injection layer intermediate said anode and cathode.

In another aspect, the present invention relates to an organic light emitting device including an anode, a cathode including hafnium oxynitride, an organic hole transport layer intermediate the anode and cathode, an organic light emission layer intermediate the anode and cathode, and an organic electron injection layer intermediate the anode and cathode.

In yet another aspect, the present disclosure relates to an organic light emitting device including an anode, a cathode, an organic hole transport layer intermediate the anode and cathode, and organic light emission layer intermediate the anode and cathode. The organic light emission layer has a thickness which varies across the layer. An electron injection layer is intermediate the anode and cathode.

DETAILED DESCRIPTION OF THE PREFERRED EMBODIMENTS

Aspects of the exemplary embodiment relate to an organic light emitting device (OLED), a light source including an OLED, and to a method of manufacturing an OLED. It is to be appreciated that the exemplary OLED may be used for any known purpose; however, it finds particular application in general lighting and illumination applications.

In one exemplary embodiment, an OLED includes an organic electron injection layer, an organic light emission layer and an organic hole transport layer disposed between an anode and a cathode. The OLED may include various other layer combinations, including adding or removing layers. An exemplary OLED configuration comprises an anode deposited on a substrate, followed by the hole transport layer. The light emission layer may then be disposed on the hole transport layer, followed by the electron injection layer and finally the anode. It is to be appreciated, however, that the OLED may comprise numerous configurations that vary in the number, type and order of the organic layers.

Figure 1:
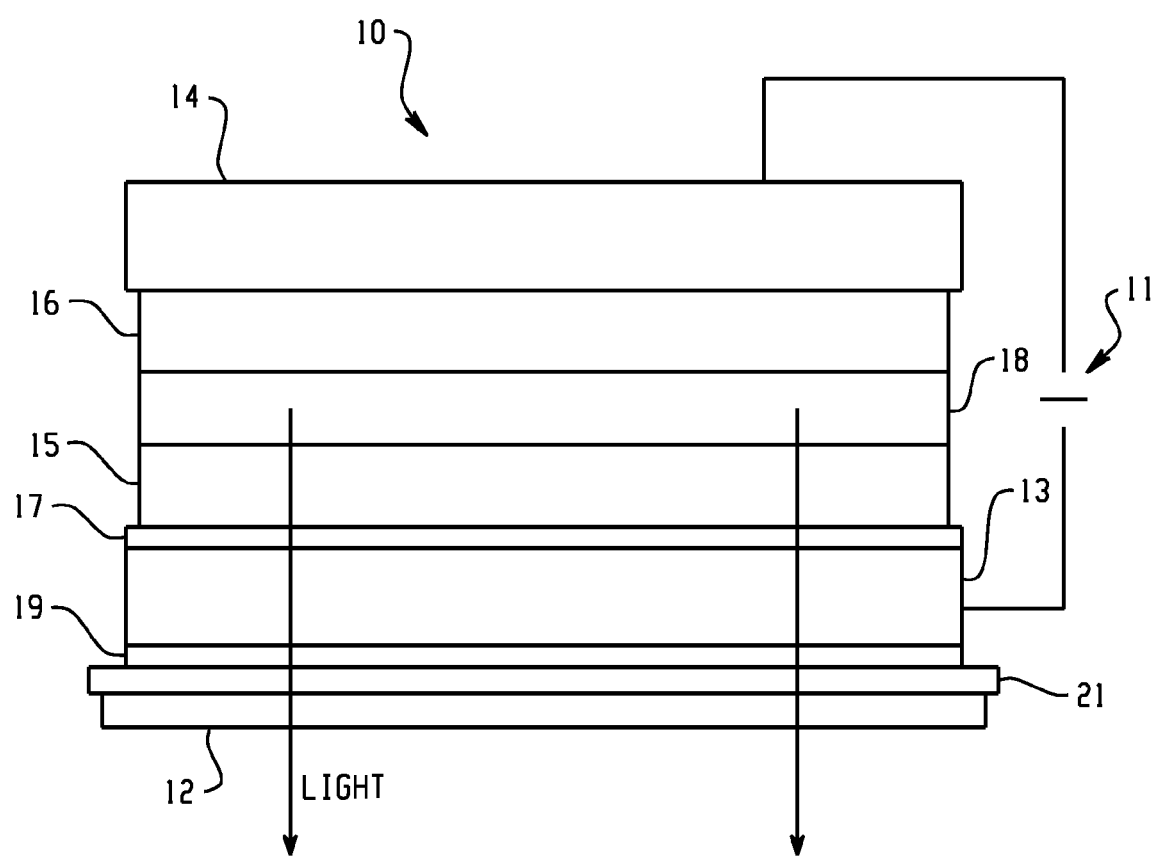
FIG. 1 is a cross-sectional view of an organic light emitting device according to one exemplary embodiment.

FIG. 1 represents an OLED 10 in accordance with one exemplary embodiment. OLED 10 includes various organic layers disposed between two electrodes, namely an anode 13 and a cathode 14. Disposed intermediate the cathode 14 and anode 13 are a hole transport layer 15, an electron injection layer 16, and an optional light emission layer 18. The OLED 10 may additionally include a voltage source 11 attached to the cathode 14 and anode 13 by electrical conductors In one embodiment, the cathode 14 comprises hafnium, which may be in the form of hafnium oxynitride (HfON). Hafnium oxynitride has a relatively high heat and oxidation resistance, thereby improving the OLED's ability to withstand various elements. Further, the conductivity of hafnium oxynitride does not attract water or oxygen as do conventional cathode materials. The hafnium oxynitride layer may have a thickness of at least 25 nanometers (nm): e.g., at least 50 nm. The hafnium oxynitride layer may further have a thickness of less than about 200 nm, e.g., a thickness of approximately 100 nm. The cathode 14 may comprise hafnium oxynitride exclusively or the cathode may include a combination of hafnium oxynitride with one or more materials. Examples of such other materials include metallic materials, such as Ni, Al, Ti, their alloys, and combinations thereof. Other suitable materials for use in the cathode include conductive polymers, such as polythiophene, poly(p-phenylene vinylenes) (PPVs), poly (3-alkyl thiophenes) (P3ATs), nickelphthalocyanine, and combinations thereof. The conductive polymer may be present as a layer separate from the hafnium oxide layer. The thickness of the separate layer may be less than the thickness of the HfON layer. In one embodiment, hafnium comprises at least twenty-five (25) percent by weight of the cathode composition, e.g. at least fifty (50) percent by weight of the cathode composition.

The anode 13 may supply holes to the layers when connected to a voltage source 11 and at a higher electrical potential than the cathode. The anode 13 may comprise a lanthanide oxide. The lanthanide oxide may include one or more lanthanides and may further include other elements as a mixed oxide. The lanthanide oxide may include a lanthanide selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and combinations thereof. In one exemplary embodiment, the lanthanide oxide includes at least one of lanthanum oxide ($La_2O_3$), terbium oxide ($Tb_4O_7$), erbium oxide ($Er_2O_3$), lutetium oxide ($Lu_2O_3$). Exemplary mixed oxides may include ternary oxides such as $Nd_{0.5}Sr_{0.5}MnO_3$, $Nd_{0.5}Ca_{0.5}MnO_3$, $Sm_{0.5}Ca_{0.5}MnO_3$, $Dy_{0.5}Ca_{0.5}MnO_3$ and $Ho_{0.5}Ca_{0.5}MnO_3$, $LaNi_xFe_{1-x}O_3$ (where $0<x<0.9$), $La_{1-y}Nd_yFe_{0.5}Cr_{0.5}O_3$ (where y=0.10, 0.15 or 0.20), $La_{0.7}Sr_{0.3}Mn_{1-z}Ti_zO_3$ (where z=0, 0.10, 0.20, or 0.30), $M_3Fe_4V_6O_{24}$ (where M is selected from zinc (Zn), manganese (Mn)), and combinations thereof. The lanthanide oxides may be doped with a conductive element, which may be in the form of a conductive chain network. In one embodiment the conductive element includes titanium, rubidium, or a combination thereof. The doped oxide may include at least 20% of the conductive element. In one embodiment, the conductive element is present at less than 80%. This helps to ensure conductivity for efficient charge transport. In one exemplary embodiment the anode includes titanium (Ti) doped lanthanum oxide, or other doped lanthanide oxides at a concentration of at least 10 wt. % of the anode, such as at least 50 wt. % or at least wt. 90%. In one embodiment, the Ti-doped lanthanum oxide comprises at least 5 wt. % titanium, e.g., approximately 20 wt. % titanium and approximately 80 wt. % lanthanum oxide. However the percentage distribution may be adjusted. The anode 13 may be formed by any method known in the art. In one embodiment, the anode 13 is formed by thermally evaporating a lanthanide oxide. such as lanthanum oxide, and a titanium or rubidium source (or a mixed source) under very high vacuum. The Ti/Rb-doped lanthanum oxide anode 13 may have a thickness of less than approximately 250 nm; e.g., 200 nm or less. Additionally, the Ti/Rb-doped lanthanide oxide may have a thickness of at least 2 nm; e.g. approximately 5 nm.

The OLED may further include an electron injection layer 16. In one exemplary embodiment, the electron injection layer 16 is disposed directly adjacent the cathode 14, creating a cathode bi-layer. The association of the electron injection layer 16 with the cathode 14 in a bi-layer improves the efficiency of electron injection. It is proposed that the bi-layer can create an additional interface, which will slow the movement of current and thereby reduce the decay of organic material in the OLED. The electron injection layer 16 may have a thickness of at least 0.01 nm; e.g., at least 0.1 nm. In one embodiment, the thickness is no greater than 5 nm; e.g., 2 nm. The electron injection layer 16 may comprise a magnetic metal halide. The magnetic metal halide may be selected from the group consisting of, but not limited to, halides of nickel, silver, chromium, manganese, cesium, iron and combinations thereof. Magnetic materials improve the efficiency of electron injection. In one embodiment, the halide is chosen from fluoride, iodide, or a combination thereof, although other halides may be used. The magnetic metal halide may be present in the electron injection layer as a combination with other materials. In one embodiment, the electron injection layer includes at least 10 wt. % or at least 25 wt. % magnetic metal halide, e.g., up to 100 wt. %. In one exemplary embodiment, the electron injection layer 16 includes nickel fluoride at a concentration of at least 10 wt. %.

The OLED 10 may further include an organic light emission layer 18 disposed between the anode and cathode. In the exemplary embodiment, light emission layer 18 spaces the hole transport layer 15 from the electron injection layer 16. The light emission layer 18 may comprise any material commonly known the art. In one embodiment the light emission layer comprises tris(8-hydroxyquinoline) aluminum (III) ($Alq_3$). This material may be doped with one of platinum, nickel or chromium octaethylporphyrin, or a combination thereof, e.g., $Alq_3$ doped with nickel octaethylporphyrin (NiOEP) in an amount of at least 1% by weight nickel, e.g., about 5 wt. %.

In one embodiment, the OLED 10 comprises a hole transport layer 15 intermediate the anode 13 and cathode 14. The hole transport layer 15 is an organic layer that is readily able to transport the holes supplied by the anode 13. In one exemplary embodiment, the organic hole transport layer 15 includes a triarylamine, such as naphthyl-substituted benzidine derivative, such as 4,4'-bis[N-(1-naptithyl-D-N-phenylamino]-biphenyl (α-NPD), N,N'(3-methylphenyl)-1,1"-biphenyl-4,4'-diamine, (TPD), or a mixture thereof. Layer 15 may have a thickness of approximately 60 nm. It is to be appreciated however, that numerous other organic materials, now known or future discoveries, and other layer thickness, could be used to achieve desired characteristics.

In addition, the OLED 10 may comprise one or more interface layers 17 and 19, which may be formed from gold. An interface layer may be positioned between any of the organic layers 15, 16. 18 in the OLED. However, in one embodiment, gold layers 17 and 19 are positioned immediately above and below the anode 13, respectively. The gold layers 17 and 19 may be approximately 10 nm or less in thickness; e.g. about 5 nm or less. A layer of gold which is too thick may potentially block the light. In one embodiment, the gold layers are each at least 1 nm in thickness. The gold layers 17 and 19 lining the top portion and bottom portion of the anode enhance efficiency and interface coupling between the anode and the substrate and the anode 13 and the hole transport layer 15. Gold is conductive and helps inject electrons to the system very quickly. Other metals may be used in place of gold for interface layers 17, 19, for example copper, platinum or nickel. However such metals risk becoming oxidized in the long term.

A substrate 12 may provide support for the OLED. The substrate may comprise any suitable material known in the art, such as glass or silicon. The exemplary substrate is optically transparent, allowing light generated in the device to pass therethrough. In one embodiment, the substrate has a thickness of at least about 0.1 mm; e.g., less than about 1.5 mm; e.g., 0.7 mm. Optionally, the substrate 12 may be coated with a compliance and/or heat absorbing layer 21 such as a mixture comprising vinylidene fluoride, trifluoroethylene and a phthalocyanine compound. As an example, layer 21 may comprise 70% vinylildene flouride-trifluoroethylene and 30% gold phthalocyanine; however other known materials may be used. The exemplary layer 21 protects the substrate from cracking and also has better agreement with the gold layer 19 that may be placed on top than the substrate 12 directly. Since a silicone substrate is generally more flexible than glass, in cases where silicone is used, there may be no need for a compliance layer 21. However, the layer 21 used in conjunction with other layers can reduce heating and provide efficient charge transport for improved stability and light emission.

Figure 2:
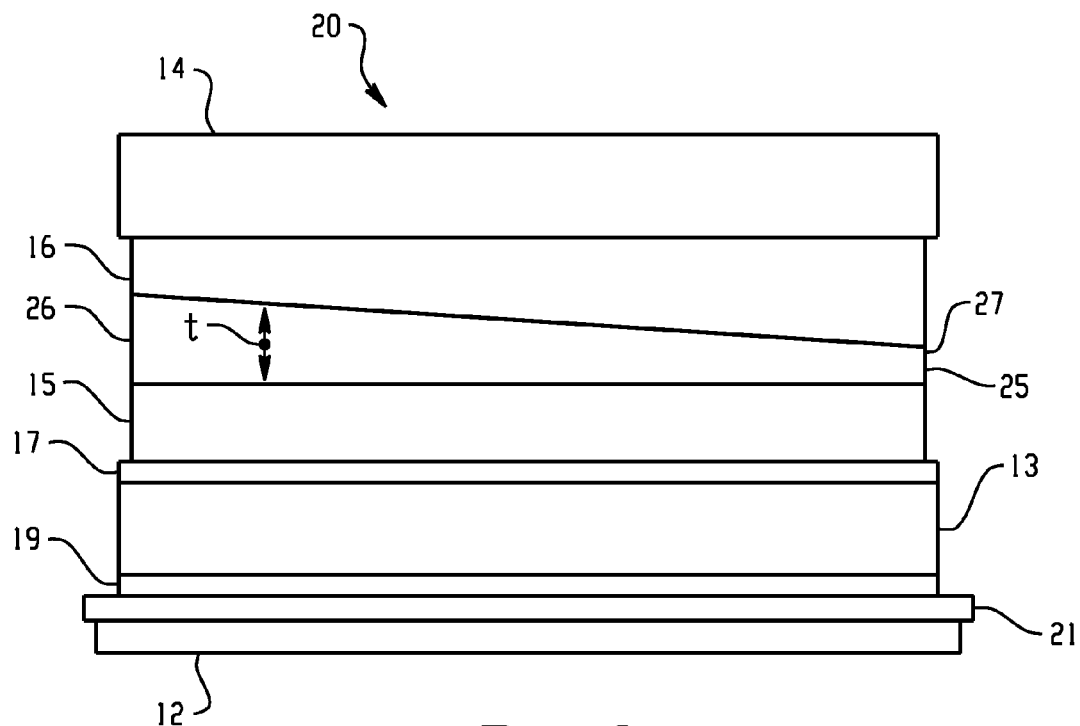
FIG. 2 is a cross-sectional view of another organic light emitting device according to another exemplary embodiment.

FIG. 2 shows another exemplary embodiment of an OLED where similar elements are accorded the same numerals as in FIG. 1. A light emission layer 25, which may be formed similarly to light emission layer 18, has a thickness gradient, meaning that the thickness t of the layer is not uniform. The emission of light emitting material changes with thickness; therefore, a variable thickness provides for a broader wavelength range and better color production than an emission layer of uniform thickness. The minimum thickness of the layer may be at least 5 nm; e.g., at least 10 nm. In general, a thinner layer is not useful as it may not result sufficient emission. In addition, the maximum thickness of the layer 25 may be less than 250 nm; e.g., up to about 200 nm. The thickness gradient can be at least 2:1. (i.e. the greatest thickness is at least twice the minimum thickness). e.g., at least 10:1. The gradient may be about 20:1 or higher for a greater wavelength distribution. For example, in one embodiment, the thickest portion of the layer may be approximately 200 nm, while the thinnest portion of the layer may be approximately 10 nm. The gradient may be of any variation or slope. FIG. 2 illustrates one exemplary variation in which one end of the layer is relatively thin, and the thickness gradually increases in a uniform manner. However, the layer may assume numerous different gradients. For example, the minimum thickness of the layer 25 may be spaced from the sides 26, 27.

The materials for layers 16, 18, 15, 17, 19, 21, 25 or anode 13 and cathode 14, mentioned above are suitably deposited through any method known and commonly used in the art, such as vacuum deposition, thermal evaporation, vapor-phase deposition and inkjet printing. The various layers and anode and cathode 13, 14, 16, 18, 15, 17, 13, 19, 21 and 25 of the exemplary OLED can be laid down on the substrate by a variety of techniques, such as thermal deposition, chemical vapor deposition, ink jet printing techniques, and combinations thereof.

In one exemplary embodiment, a light source, such as a lamp includes at least one OLED 10 as described. Two or more OLEDs may be formed on a common substrate. In another embodiment, a display such as a TV screen includes an array of OLEDs as described herein.

Without intending to limit the scope of the exemplary embodiment, the following example demonstrates the benefit of a light emission layer with a thickness gradient.

EXAMPLE

Figure 3:
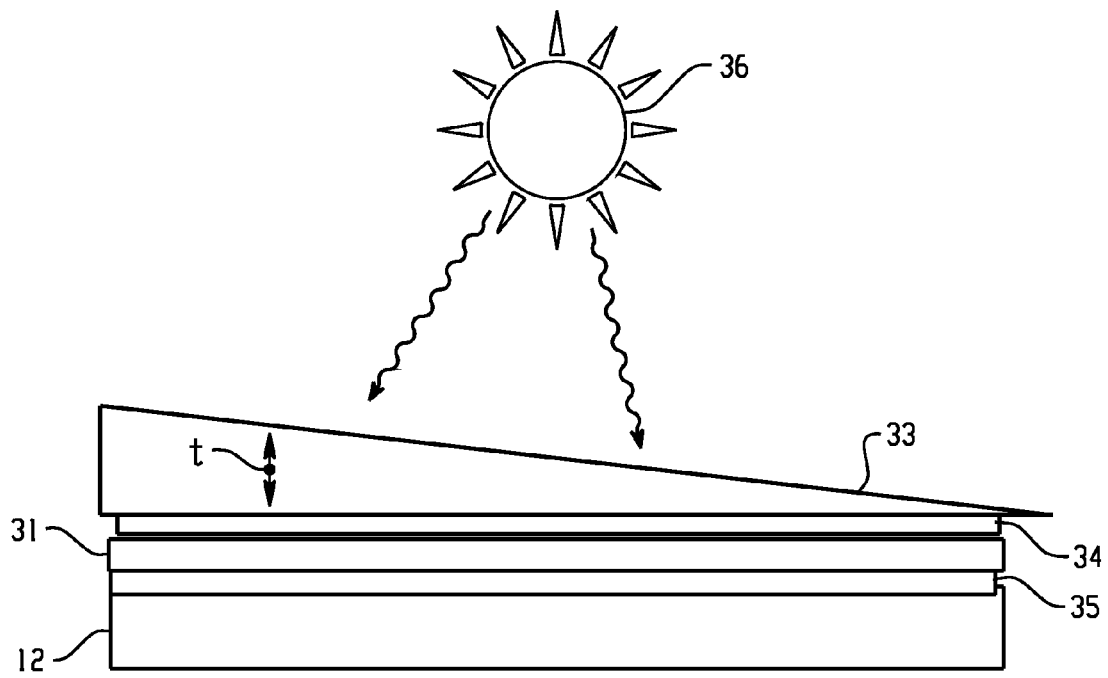
FIG. 3 is a cross-sectional view of an experimental OLED for purposes of testing emission.
Figure 4:
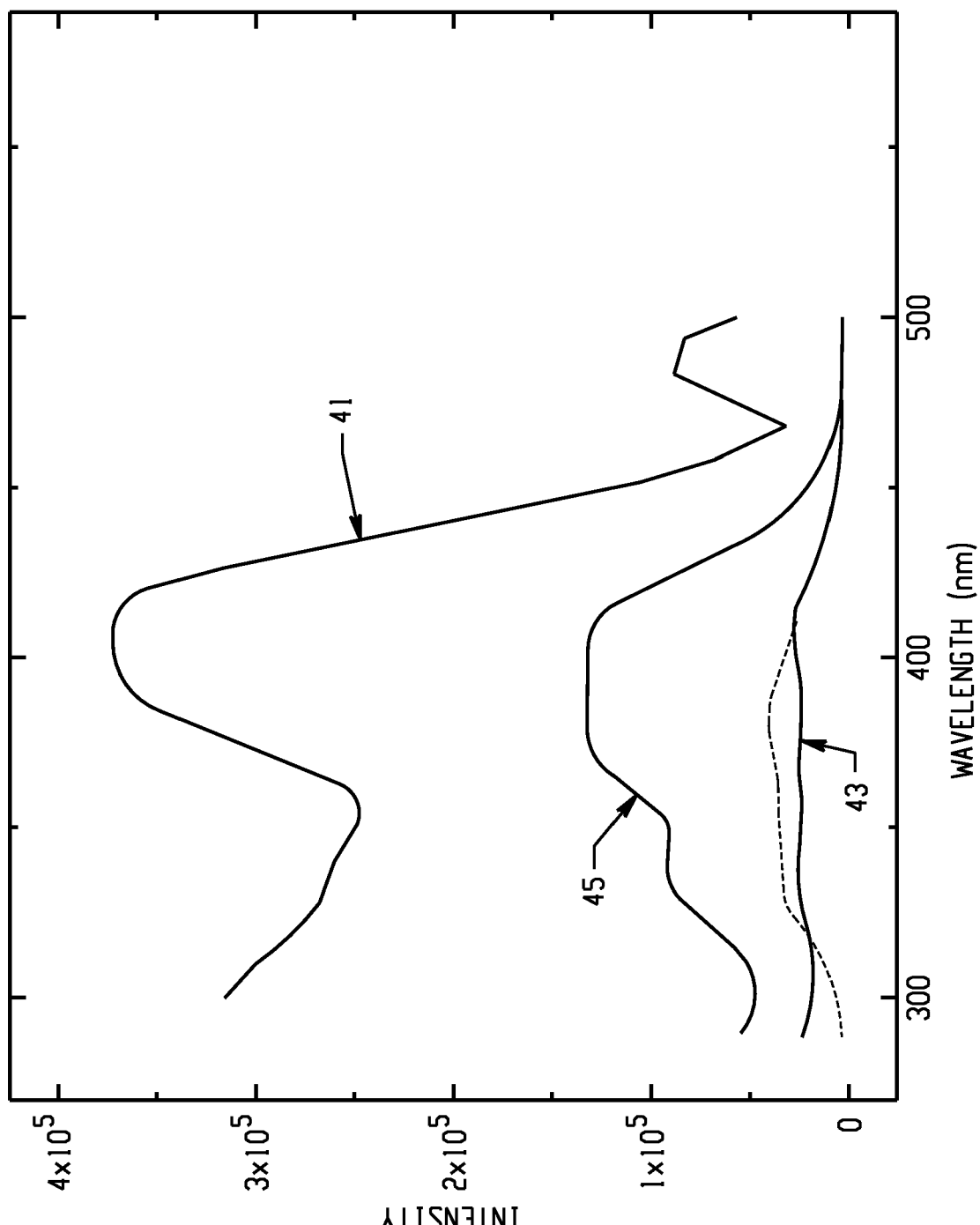
FIG. 4 is a graphical representation of the intensity of light emitted by an organic light emitting diode over the wavelength range of 380 nm to 500 nm.

This example demonstrates the emission properties of one possible variation of the gradient of an OLED's emission layer. An OLED was formed according to the structure shown in FIG. 3. Using a glass substrate 12 for support an anode 31 was sandwiched between two layers of gold 34, 35 and a nickel doped Alq3 light emission layer 33 was disposed over the top gold layer 34. No contact was used on top of the light emission layer. To form the anode 31, 20% titanium was mixed with lanthanum oxide and the mixture was thermally evaporated under very high vacuum. The thickness of the light emission layer 33 was varied to have a maximum thickness of about 200 nm and a minimum thickness of about 10 nm. Photoluminescence data was taken in matrix form using a Xenon lamp 36 as an excitation source with auto correction for reflection. The material was excited using the lamp 36 and emission was collected with a UV-visible spectrometer inside a vacuum chamber. As illustrated in FIG. 4, the varied thickness enabled the OLED to emit light in a broad range of wavelengths and intensity for balanced light color. Top line 41 represents an $Alq_3$ light emission layer thickness t of about 150 nm, the middle line 45 represents a thickness t of about 50 nm and the bottom line 43 represents a thickness t of about 10 nm. A layer which varies in thickness combines each of these emission spectra resulting in an overall spectrum. The gradient layer 25 thus provides a broader wavelength for better, more balanced color than an $Alq_3$ layer with only a single, uniform thickness.

The invention has been described with reference to the preferred embodiments. Obviously, modifications and alterations will occur to others upon reading and understanding the preceding detailed description. It is intended that the invention be construed as including all such modifications and alterations.

What is claimed is:

1. An organic light emitting device comprising:
    an anode, comprising a lanthanide oxide wherein said oxide is doped with a conductive material selected from the group consisting of rubidium, titanium, and combinations thereof;
    a cathode;
    an organic hole transport layer intermediate the anode and cathode; and
    an electron injection layer intermediate the anode and cathode.

2. The organic light emitting device of claim 1, further including an organic light emission layer intermediate the anode and cathode.

3. The organic light emitting device of claim 2, wherein said organic light emission layer has a thickness which varies across the layer.

4. The organic light emitting device of claim 3, wherein said light emission layer has a maximum thickness of up to 250 nm.

5. The organic light emitting device of claim 3, wherein said light emission layer has a minimum thickness of at least 5 nm.

6. The organic light emitting device of claim 3, wherein a ratio between a thickest portion and thinnest portion of said light emission layer is at least 2:1.

7. The organic light emitting device of claim 1, wherein said light emission layer comprises tris(8-hydroxyquinoline) aluminum doped with a material selected from the group consisting of platinum octaethylporphyrin, nickel octaethylporphyrin, and chromium octaethylporphyrin, and mixtures thereof.

8. The organic light emitting device of claim 1, wherein said lanthanide oxide includes a oxide selected from the group consisting of $La_2O_3$, $Tb_4O_7$, $Er_2O_3$, $Lu_2O_3$, $Nd_{0.5}Sr_{0.5}MnO_3$, $Nd_{0.5}Ca_{0.5}MnO_3$, $Sm_{0.5}Ca_{0.5}MnO_3$, $Dy_{0.5}Ca_{0.5}MnO_3$ and $Ho_{0.5}Ca_{0.5}MnO_3$, $LaNi_xFe_{1-x}O_3$ where $0<x<0.9$, $La_{1-y}Nd_yFe_{0.5}Cr_{0.5}O_3$ where $y=0.10$, $0.15$ or $0.20$, $La_{0.7}Sr_{0.3}Mn_{1-z}Ti_zO_3$ where $z=0$, $0.10$, $0.20$, or $0.30$, $M_3Fe_4V_6O_{24}$ where M is selected from Zn or Mn, and combinations thereof.

9. The organic light emitting device of claim 1, wherein said anode has a thickness of at least 5 nm.

10. The organic light emitting device of claim 1, wherein said anode has a thickness of no more than 200 nm.

11. The organic light emitting device of claim 1, wherein said electron injection layer includes a magnetic metal halide.

12. The organic light emitting device of claim 11, wherein said magnetic metal halide comprises a halide of a metal selected from the group consisting of nickel, silver, chromium, manganese, cesium, iron and combinations thereof.

13. The organic light emitting device of claim 1, wherein said electron injection layer has a thickness of at least 0.1 nm.

14. The organic light emitting device of claim 1, wherein said cathode comprises hafnium oxynitride.

15. The organic light emitting device of claim 14, wherein the cathode further comprises a material selected from the group consisting of aluminum, nickel, titanium, alloys of aluminum, nickel, and titanium, and conductive polymers.

16. The organic light emitting device of claim 15, wherein said conductive polymer is selected from a group consisting of polythiophene, poly(p-phenylene vinylenes), poly(3-alkyl thiophenes), nickelphthalocyanine, and combinations thereof.

17. The organic light emitting device of claim 1, wherein said cathode has a thickness of between 50 and 200 nm.

18. The organic light emitting device of claim 1, wherein an interface layer spaces said anode from said hole transport layer.

19. The organic light emitting device of claim 1, wherein said organic light emitting device is supported by a transparent substrate.

20. The organic light emitting device of claim 19, wherein said substrate is made of glass.

21. The organic light emitting device of claim 19, further including a compliance and/or heat absorbing layer between said substrate and said anode.

22. A light source comprising at least one organic light emitting device according to claim 1.

23. A method of manufacturing an organic light emitting device comprising:
   forming an anode comprising a lanthanide oxide doped with at least one of titanium and rubidium;
   forming a cathode;
   disposing an organic hole transport layer intermediate said anode and cathode;
   disposing an organic light emission layer intermediate said anode and cathode; and
   disposing an electron injection layer intermediate said anode and cathode.

24. An organic light emitting device comprising:
   an anode comprising a lanthanide oxide wherein said oxide is doped with a conductive material selected from the group consisting of rubidium, titanium, and combinations thereof;
   a cathode including hafnium oxynitride;
   an organic hole transport layer intermediate the anode and cathode;
   an organic light emission layer intermediate the anode and cathode; and
   an electron injection layer intermediate the anode and cathode.

25. An organic light emitting device comprising:
   an anode comprising a lanthanide oxide wherein said oxide is doped with a conductive material selected from the group consisting of rubidium, titanium, and combinations thereof;
   a cathode;
   an organic hole transport layer intermediate the anode and cathode;
   an organic light emission layer intermediate the anode and cathode, wherein said organic light emission layer has a gradient, in which the thickness varies across the layer; and
   an electron injection layer intermediate the anode and cathode.

* * * * *